United States Patent
Hirabayashi et al.

(10) Patent No.: US 6,184,059 B1
(45) Date of Patent: *Feb. 6, 2001

(54) PROCESS OF MAKING DIAMOND-METAL OHMIC JUNCTION SEMICONDUCTOR DEVICE

(75) Inventors: Keiji Hirabayashi, Tokyo; Masaaki Matsushima, Yokohama, both of (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 08/578,373

(22) Filed: Dec. 26, 1995

Related U.S. Application Data

(62) Division of application No. 08/271,575, filed on Jul. 7, 1994, now abandoned, which is a continuation of application No. 07/900,111, filed on Jun. 17, 1992, now abandoned.

(30) Foreign Application Priority Data

Jun. 21, 1991 (JP) .................................................. 3-150317

(51) Int. Cl.⁷ .................................................. M01L 21/00
(52) U.S. Cl. ............................................. 438/105; 438/969
(58) Field of Search .................................... 257/76, 77, 78; 117/929; 427/113, 249, 577; 423/446; 428/408; 437/180

(56) References Cited

U.S. PATENT DOCUMENTS

| 3,665,193 | * | 5/1972 | Kozlov et al. .................... 250/83 R |
| 4,104,441 | * | 8/1978 | Fedoseev et al. ..................... 427/249 |
| 5,036,373 | * | 7/1991 | Yamazaki ............................. 357/17 |
| 5,070,274 | * | 12/1991 | Yoshikawa et al. ................. 423/446 |
| 5,196,366 | * | 3/1993 | Yamazaki et al. .................... 437/61 |

FOREIGN PATENT DOCUMENTS

| 0304220 | * | 2/1989 | (EP) . |
| 2236902 | * | 4/1991 | (GB) . |
| 2041800 | * | 2/1987 | (JP) . |
| 1216561 | * | 8/1989 | (JP) . |
| 2-34979 | | 2/1990 | (JP) . |
| 2-78271 | | 3/1990 | (JP) . |
| 3-58481 | | 3/1991 | (JP) . |
| 3058481 | * | 3/1991 | (JP) . |

* cited by examiner

Primary Examiner—Richard Elms
Assistant Examiner—Michael S. Lebentritt
(74) Attorney, Agent, or Firm—Fitzpatrick, Cella, Harper & Scinto

(57) ABSTRACT

A diamond product comprising a semiconductor layer having an outer surface region of graphite in contact with the metal electrode to form an ohmic junction with the metal electrode, wherein the outer surface region of graphite has a thickness of at least about 12 Å.

4 Claims, 3 Drawing Sheets

PROCESS OF MAKING DIAMOND-METAL OHMIC JUNCTION SEMICONDUCTOR DEVICE

This application is a division of application Ser. No. 08/271,525, filed Jul. 7, 1994, now abandoned, which was a continuation of application Ser. No. 07/900,111, filed Jun. 17, 1992, now abandoned.

BACKGROUND OF THE INVENTION

1. Field of the Invention

The present invention relates to a diamond-metal junction product in which a diamond semiconductor and a metal are integrated through an ohmic junction.

2. Description of the Related Art

In general, diamond has a large band gap of about 5.5 eV and a large carrier mobility (1800 $cm^2$/V·S for electrons and 1600 $cm^2$/V·S for holes), as well as a large thermal conductivity of about 20 W/cm·k. In addition, diamond exhibits a very high level of hardness and, hence, superior wear resistance. Thus, diamond possesses various advantageous properties which can never be offered by other materials.

In recent years, remarkable progress has been achieved in the technique for synthesizing diamond from gaseous phases, and it is now possible to form a diamond film by chemical vapor deposition (CVD).

Studies also have been made to develop a technique for producing semiconductors by doping diamond crystals with impurities. Shiomi et al. reported that a field effect transistor can be produced by forming, on an artificial diamond substrate, a diamond film containing boron as an impurity by a vapor synthesis technique and then forming Schottky junction metal and ohmic junction metal.

Hitherto, however, it has been difficult to form metal electrodes on diamond crystal by diamond-metal junction with a high degree of reproducibility of the characteristics of the product. Namely, characteristics of a diamond-metal junction material largely vary according to factors such as the conditions for forming the diamond, the conditions of processing after formation of the diamond and the methods of forming the electrodes.

For instance, whether the type of junction formed is an ohmic junction or a Schottky junction depends on whether a methane-hydrogen type gas or a carbon monoxide-hydrogen type gas is used as the material gas in forming the diamond. It is also known that a metal junction which has exhibited an ohmic nature is changed into a metal junction exhibiting a Schottky nature when diamond crystal is scrubbed with a chromic acid mixed solution. Characteristics also vary largely depending on whether the metal electrode is formed to make a point conduct or evaporation-deposited on the diamond layer.

Thus, it has been difficult to obtain a product having metal electrodes by a diamond-metal junction with a high degree of reproducibility.

SUMMARY OF THE INVENTION

Accordingly, it is an object of the present invention to provide a diamond-metal junction product which exhibits excellent ohmic characteristics.

A second object of the present invention is to provide ohmic junction electrodes which can be formed with high degree of reproducibility.

A third object of the present invention is to provide a diamond-metal junction product in which an ohmic junction is formed between a semiconductor diamond layer and a metal layer through the intermediary of a graphite layer having a thickness of at least 12 Å.

A fourth object of the present invention is to provide a diamond product comprising a stabilized outer surface of graphite formed on a diamond layer, wherein said outer surface of graphite has a thickness of at least 12 Å.

A fifth object of the present invention is to provide a diamond product comprising a semiconductor diamond layer having an outer surface region of graphite in contact with a metal electrode to form an ohmic junction with the electrode, wherein the outer surface region has a thickness of at least about 12 Å.

DESCRIPTION OF THE PREFERRED EMBODIMENTS

Figure 1A:
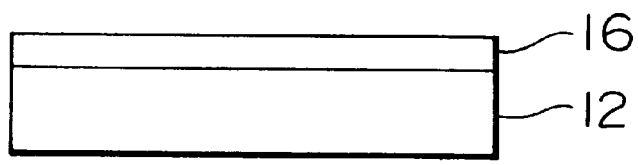
FIG. 1A is an illustration of a diamond layer having an outer surface of graphite.

In a preferred form of the diamond-metal junction product of the present invention, an ohmic junction is formed between a semiconductor diamond layer and a metal layer through the intermediary of a graphite layer having a thickness of at least about 12 Å.

According to the invention, it is possible to obtain a diamond-metal junction product which exhibits excellent ohmic characteristics.

According to the invention, it is also possible to form, with a high degree of reproducibility, metal electrodes on a semiconductor diamond layer, by forming a graphite layer having a thickness of at least about 12 Å on the semiconductor diamond layer, before forming the metal electrodes.

Through an intense study, the present inventors have found that the metal junction characteristics are largely governed by the state of the surface of the diamond layer, e.g., the molecular nucleus adsorbed on the diamond surface. The inventors have found that the production of a diamond-metal junction product is best achieved with the stabilization of the state of the diamond surface. With this knowledge, the inventors have conducted experiments to discover conditions for stabilizing the diamond surface and found that superior ohmic junction characteristics can be obtained with a high degree of reproducibility when a graphite region is formed on the surface of the diamond layer.

By forming a graphite layer of about 12 Å or thicker, it is possible to reduce the influence of nucleus adsorbed on the diamond surface, thus stabilizing the state of the diamond layer surface. The reason why such stabilization is attained has not yet been theoretically determined. It is, however, considered that this advantageous effect owes to the fact that the graphite layer having metallic characteristics can be directly formed on the diamond layer surface without any intermediary because both graphite and diamond contain carbon atoms. Amorphous carbon which has comparatively high resistivity is not suitable for use as the junction layer in the diamond-metal junction product of the present invention, and graphite layer having low resistivity is preferably used as the junction layer. Discrimination between diamond crystals, graphite crystals and amorphous carbon is possible by various methods such as observation of lattice image through an electron microscope or electron bean diffraction. It is also possible to discriminate by spectral analysis of valence band such as by using XPS (X-ray photoelectron spectroscopy) or ELS (energy loss spectroscopy).

The thickness of the graphite layer is about 12 Å or greater, preferably about 15 to 500 Å, and more preferably about 20 to 100 Å. It is not always necessary that the graphite layer is formed uniformly over the entire area of the diamond layer. When the thickness of the graphite layer varies according to position, it is preferred that the mean thickness falls within the range stated above. Thus, the graphite layer may be formed only on an area where a metal electrode is to be formed. The above-described effect of graphite layer for stabilizing the state of the diamond layer surface is not appreciable when the thickness of the graphite layer is about 10 Å or less, and is saturated when the graphite layer thickness is increased beyond 500 Å.

There is no restriction in regard to the method of forming the graphite layer. For instance, the graphite layer can be formed by annealing the diamond layer in an inert gas atmosphere at a temperature not lower than 800° C., preferably not lower than 1000° C., so as to graphitize the diamond layer surface. It is also possible to form the graphite layer by increasing the concentration carbon source and substrate temperature in the final stage of synthesis of the diamond. When the graphite layer is formed by elevating the carbon source concentration and substrate temperature in the final stage of the diamond synthesis, the elevated carbon source concentration is, for example, 1.2% or higher in terms of carbon-containing gas, e.g., methane, and the elevated substrate temperature is, for example, 1000° C. or higher.

The graphite layer is a region of graphite forming the outer surface of the diamond layer. The graphite layer can be a region of graphite as formed above. Further, a discrete graphite layer can be formed by conventional methods on the diamond layer such as by chemically vapor depositing a graphite layer onto the diamond layer or by bonding or laminating a graphite layer to the diamond layer to form a graphite surface on the diamond layer.

In this specification, the term "metal" is used to generally cover metals and alloys usable as the material of the ohmic electrode, unless otherwise specified. More specifically, such metal includes Pt, Au, Ag, Cu, Ti, Zr, Hf, V, Nb, Cr, Mo, Mn, W, Sn, Zn, Ta, Al, Si, Fe, Co, Ni and other metals, alloys of such metals, as well as carbides, sulfides and borides thereof.

The electrode may be formed by a known technique such as vacuum evaporation, sputtering and so forth.

Figure 1B:
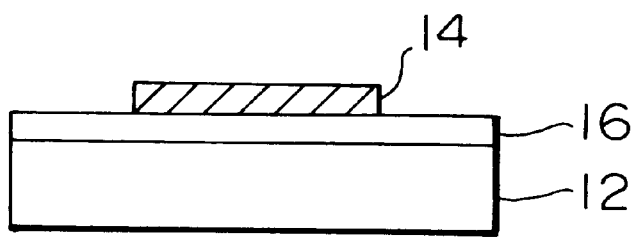
FIG. 1B is an illustration of a diamond layer having an outer surface of graphite in contact with a metal electrode.
Figure 1C:
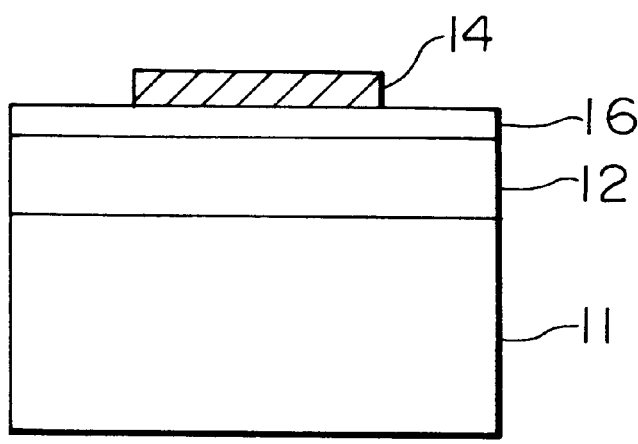
FIG. 1C is an illustration of a diamond layer having an outer surface of graphite in contact with a metal electrode, wherein the diamond layer is supported by a substrate.

FIG. 1A shows a diamond layer 12 having an outer surface region or layer of graphite 16. FIG. 1B shows the diamond layer 12 having an outer surface region or layer of graphite 16 in contact with a metal electrode 14. FIG. 1C shows the diamond layer 12 having an outer region or layer of graphite 16 in contact with the metal electrode 14, where the diamond layer 12 is superposed by a substrate 11.

Figure 2:
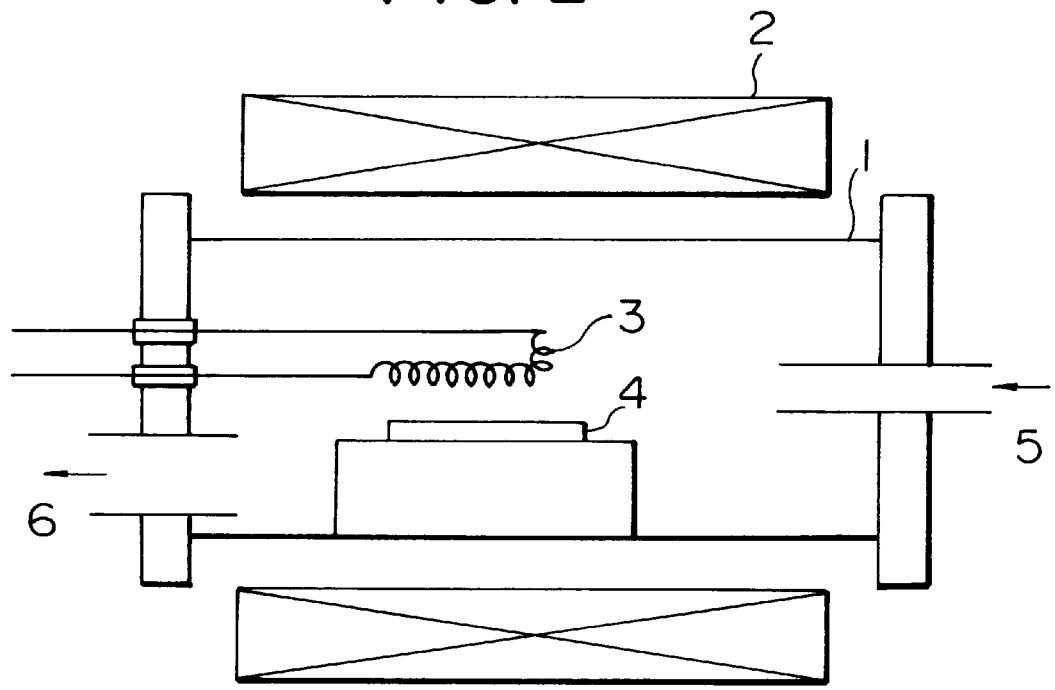
FIG. 2 is a schematic illustration of a diamond forming apparatus suitable for use in forming a diamond layer of a diamond-metal junction product in accordance with the present invention.

The vapor phase synthesis of diamond is conducted preferably but not exclusively by CVD (chemical vapor deposition). FIG. 2 shows a CVD apparatus suitably employed in the production of diamond. The apparatus has a quartz reaction tube 1, a heater 2 and a tungsten filament 3. Numeral 4 designates a silicon substrate. The quartz reaction tube 1 has a gas inlet port 5 and a discharge port 6 which is connected to an evacuating device and a pressure regulating valve which are not shown. The material gas for forming diamond crystal may be a hydrocarbon gas such as methane or ethane or a gas obtained by heating a liquid organic compound such as alcohol and acetone. The material gas, when introduced into the reaction tube, may be diluted by hydrogen or oxygen as required. In order to form a semiconductor diamond, a compound containing boron, phosphor, nitrogen or lithium is added to the material gas. The material gas containing such compound is decomposed by the heat from the filament 3 which is heated to about 2000° C., so that diamond crystals are formed on the substrate. The described method of forming diamond, however, is not exclusive and various other methods can be employed such as microwave plasma CVD, radio-frequency plasma CVD, D.C. plasma CVD, field microwave plasma CVD and burning flame method.

EXAMPLES

Examples of production of diamond-metal junction product of the present invention are shown below.

Example 1

A semiconductor diamond was formed by using the apparatus shown in FIG. 2.

A single-crystal silicon substrate was placed as the substrate 4 within the quartz reaction tube 1. The single-crystal silicon substrate had a diameter of 25 mm, thickness of 0.5 mm and specific resistivity of 1 Ω·cm and was a p-type semiconductor. The evacuation device (not shown) was activated to reduce the pressure in the reaction tube down to $10^{-6}$ Torr and then the heater 2 was energized to heat the silicon substrate to 800° C. Subsequently, methane gas, hydrogen gas and diborane gas (concentration 1000 ppm diluted with hydrogen) were introduced into the reaction tube 1 from respective cylinders. The rates of supply of the methane gas, hydrogen gas and diborane gas were controlled to 1 SCCM, 200 SCCM and 1 SCCM, respectively, by using flowmeters and flow rate controllers. Then, the pressure regulating valve (not shown) was opened to set the pressure in the reaction tube to 50 Torr, and electrical power was supplied to the filament 3 from a power supply (not shown) so as to red-heat the filament to about 2000° C. The material was decomposed by the heated filament, whereby diamond was formed on the substrate 4.

A diamond crystal layer of about 4 μm thick was formed on the substrate after 5-hour reaction. The diamond crystal layer was then annealed in the reaction tube 1 so that the surface was graphitized. More specifically, the graphitizing annealing was conducted in a nitrogen atmosphere at a pressure of 500 Torr and a temperature of 950° C. for 10 minutes.

Figure 3:
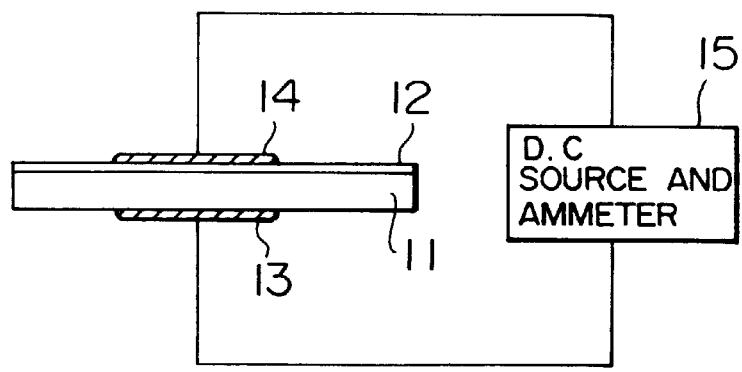
FIG. 3 is a schematic illustration of a method for measuring ohmic junction characteristics.

Then, Ti was evaporation-deposited by vacuum evaporation method on the thus graphitized surface of the diamond crystal layer, and I–V characteristics were measured by a method illustrated in FIG. 3. In FIG. 3, numeral 11 designates a silicon substrate, 12 denotes a diamond layer, 13 denotes a silver paste (electrode with ohmic junction with silicon), 14 denotes the evaporation-deposited Ti film and 15 denotes a D.C. source and an ammeter.

Figure 4:
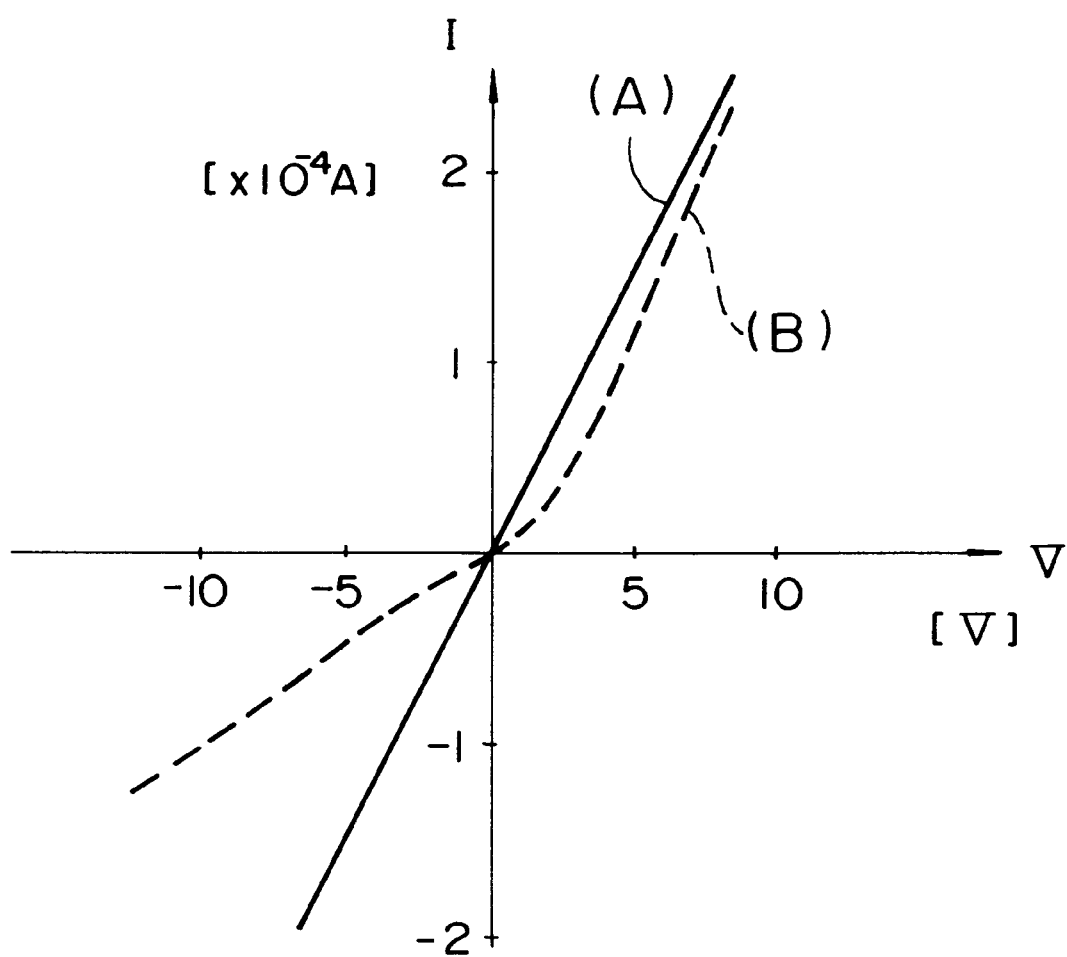
FIG. 4 is a graph showing I–V characteristics of a diamond-metal junction product of the present invention.

The line A in FIG. 4 shows the I–V characteristics as measured by the method shown in FIG. 3. It will be seen that good ohmic junction characteristics has been obtained.

Diamond crystal after graphitization conducted under the same conditions as above was observed through an electron microscope to confirm that a graphite layer of 15 Å thick was formed on the surface of the diamond.

Comparative Example 1

Diamond layer was formed under the same conditions as Example 1 except that the graphite layer was not formed, and the I–V characteristics of a sample thus obtained were measured. The characteristics as measured were shown by the curve B in FIG. 4. It will be seen that ohmic junction characteristics are inferior in this case.

Example 2

After forming a diamond crystal layer by the same method as Example 1, a graphite layer was formed by treating the diamond crystal layer for 10 seconds in the same apparatus at a pressure of 10 Torr and oven temperature of 900° C. under the supply of $CH_4$ and $H_2$ at rates of 8 SCCM and 100 SCCM, respectively, while heating the filament to 2000° C.

The diamond crystal layer with the graphite layer thus formed was subjected to measurement of I–V characteristic conducted under the same conditions as Example 1. Superior ohmic junction characteristics well comparing with that of Example 1 was confirmed.

Diamond crystal after a graphitization conducted under the same conditions as above was observed through an electron microscope to confirm that a graphite layer of 30 Å thick was formed on the surface of the diamond.

Examples 3 to 6 and Comparative Example 2

Diamonds were formed on Si substrates by microwave plasma CVD method, by supplying methane, hydrogen and diborane (concentration 100 ppm, diluted with hydrogen) at rates of 1.5 SCCM, 200 SCCM and 0.8 SCCM, respectively, while setting the microwave power to 400 W. The substrate temperature and the pressure in the quartz reaction tube were maintained at 830° C. and 50 Torr, respectively. After 6-hour synthesis operation, semiconductor diamond films of abut 5 μm were formed on the substrates.

A graphite layer was formed on each of the thus-formed diamond crystal layer by using the same apparatus as that used in Example 1. The graphitization was conducted while setting the microwave output to 500 W, at a pressure of 100 Torr and substrate temperature of 980° C., under supply of $CH_4$ and $H_2$ at 10 SCCM and 150 SCCM, respectively. The graphitization time was varied according to the samples. The samples thus obtained were subjected to measurement of ohmic junction characteristic to obtain results as shown in Table 1 below. The graphite layer thickness values were determined through electron microscopic observation.

TABLE 1

| | graphitizing time | Graphite layer thickness | Electrode material | Ohmic junction characteristic |
|---|---|---|---|---|
| Ex. 3 | 15 sec | 15Å | Au | Good |
| Ex. 4 | 60 sec | 50Å | Au | Excellent |
| Ex. 5 | 300 sec | 250Å | Pt | Good |
| Ex. 6 | 10 sec | 12Å | Ti | Acceptable |
| Ex. 7 | 600 sec | 500Å | Pt | Good |
| Comp. Ex. 2 | 5 sec | 7Å | Ti | Not good |
| Comp. Ex. 3 | 8 sec | 10Å | Ti | Not good |

While the present invention has been described with respect to what is presently considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

What is claimed is:

1. A process for forming a diamond product which comprises a stabilized outer surface of a graphite formed on a diamond layer and a metal layer, comprising the steps of:

forming the diamond layer on a substrate using a carbon-containing gas;

forming the stabilized outer surface of graphite to a thickness of 1.0 nm or more by increasing the concentration of carbon-containing gas to 1.2% or higher and increasing the substrate temperature to 1000° or higher in a final stage of forming the diamond layer; and forming the metal layer on the stabilized outer surface of graphite.

2. A process for forming a diamond product according to claim 1, wherein the steps of forming the diamond layer and forming the surface of graphite are conducted by chemical vapor deposition.

3. A process for forming a diamond-metal product comprising a semiconductor layer having a stabilized outer surface region of a graphite in contact with a metal electrode to form an ohmic junction with said metal electrode, comprising steps of:

forming the semiconductor diamond layer using a carbon source on a substrate;

forming the stabilized outer surface of graphite to a thickness of 1.0 nm or more by increasing the concentration of carbon-containing gas to 1.2% or higher and increasing the substrate temperature to 1000° C. or higher in a final stage of forming the diamond layer; and forming the metal electrode on the surface of graphite.

4. A process for forming a diamond-metal junction product according to claim 3, wherein the steps of forming the diamond layer and forming the surface of graphite are conducted by chemical vapor deposition.

* * * * *

UNITED STATES PATENT AND TRADEMARK OFFICE
CERTIFICATE OF CORRECTION

PATENT NO.   : 6,184,059 B1
DATED        : February 6, 2001
INVENTOR(S)  : Keiji Hirabayashi et al.

It is certified that error appears in the above-identified patent and that said Letters Patent is hereby corrected as shown below:

<u>Title page,</u>
Item [56] References Cited, under FOREIGN PATENT DOCUMENTS,
"1216561" should read -- 1-216561 --; and
"3058481 * 3/1991 (JP)" should be deleted.

<u>Column 3,</u>
Line 1, "owes" should read -- is due --.

<u>Column 5,</u>
Line 51, "abut" should read -- about --;
Line 55, "layer" should read -- layers --.

<u>Column 6,</u>
Line 44, "product" should read -- junction product --; and
Line 45, "layer" should read -- diamond layer --.

Signed and Sealed this

Fourteenth Day of May, 2002

Attest:

*Attesting Officer*

JAMES E. ROGAN
*Director of the United States Patent and Trademark Office*